(12) United States Patent
Hsieh

(10) Patent No.: US 8,704,297 B1
(45) Date of Patent: Apr. 22, 2014

(54) TRENCH METAL OXIDE SEMICONDUCTOR FIELD EFFECT TRANSISTOR WITH MULTIPLE TRENCHED SOURCE-BODY CONTACTS FOR REDUCING GATE CHARGE

(71) Applicant: Force Mos Technology Co., Ltd., New Taipei (TW)

(72) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 63 days.

(21) Appl. No.: 13/650,330

(22) Filed: Oct. 12, 2012

(51) Int. Cl.
*H01L 29/76* (2006.01)
*H01L 29/94* (2006.01)

(52) U.S. Cl.
USPC ........... 257/330; 257/331; 257/332; 257/341; 257/342; 438/270

(58) Field of Classification Search
USPC .................. 257/330–332, 341, 342, E29.262, 257/E21.41; 438/270
See application file for complete search history.

(56) References Cited

U.S. PATENT DOCUMENTS

| | | | | |
|---|---|---|---|---|
| 5,378,914 A | * | 1/1995 | Ohzu et al. | 257/369 |
| 6,710,403 B2 | * | 3/2004 | Sapp | 257/330 |

* cited by examiner

*Primary Examiner* — Theresa T Doan
(74) *Attorney, Agent, or Firm* — Bacon & Thomas, PLLC

(57) ABSTRACT

A trench MOSFET with multiple trenched source-body contacts is disclosed for reducing gate charge by applying multiple trenched source-body contacts in unit cell. Furthermore, source regions are only formed along channel regions near the gate trenches, not between adjacent trenched source-body contacts for UIS (Unclamped Inductance Switching) current enhancement.

8 Claims, 7 Drawing Sheets

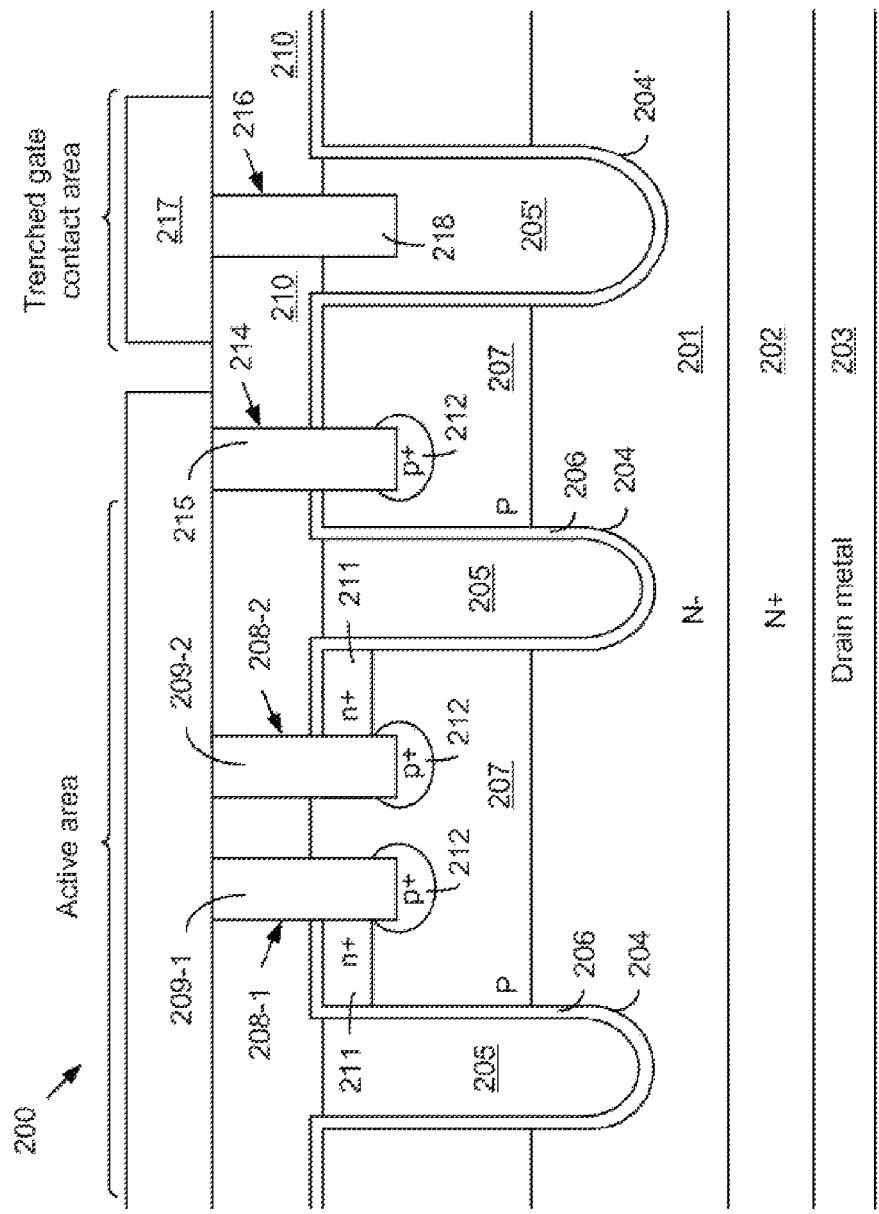

TRENCH METAL OXIDE SEMICONDUCTOR FIELD EFFECT TRANSISTOR WITH MULTIPLE TRENCHED SOURCE-BODY CONTACTS FOR REDUCING GATE CHARGE

FIELD OF THE INVENTION

This invention relates generally to the cell structure and device configuration of power semiconductor devices. More particularly, this invention relates to a novel and improved cell structure and device configuration of a trench metal oxide semiconductor field effect transistor (MOSFET, the same hereinafter) with multiple trenched source-body contacts.

BACKGROUND OF THE INVENTION

FIG. 1A shows a conventional trench MOSFET 100 of prior art, wherein a single trenched source-body contact 101 is penetrating through an n+ source region 102 and extending into a P body region 103 between two adjacent trenched gates 104 in an active area, wherein the n+ source region 102 is formed in an upper portion of the P body region 103. For trench MOSFET like the trench MOSFET 100 with voltage rating below 100V (Low Voltage), channel resistance Rch accounts for about 10% and 30% of total Rds at Vgs=10V and at Vgs=4.5V respectively for a 30V N-channel device. It can be seen that the channel resistance $R_{ch}$ plays an important role in on-resistance, especially at Vgs=4.5V. Therefore, the smaller pitch of the device, the lower $R_{ds}$. So far, the minimum 1.0 um pitch is achieved by using 0.18 um and tungsten plug technologies for a cell density around 500 M/in$^2$. However, for voltage rating beyond 100V (Middle and High Voltages), applications of the middle and high voltage devices are more at Vgs=10V. The $R_{ch}$ is less than 10% of $R_{ds}$. For trench MOSFETs having device structure as shown in FIG. 1A, no much improvement in $R_{ds}$ but significant increase in gate charge with higher cell density.

Another prior art U.S. Pat. No. 8,049,273 discloses a device structure 110 having multiple trenched source-body contacts 111 in unit cells for improving the peak induced voltage in switching converter, as shown in FIG. 1B. However, n+ source regions 112 are disposed not only along channel regions but also among the multiple trenched source-body contacts 111, causing poor avalanche capability issue because two additional parasitic n+/P/N+ bipolar transistors exist in the device structure 110.

Therefore, there is still a need in the art of the semiconductor power device, particularly for trench MOSFET design and fabrication, to provide a novel cell structure, device configuration that would resolve these difficulties and design limitations.

SUMMARY OF THE INVENTION

The present invention provides a trench MOSFET with multiple trenched source-body contacts for reducing gate charge. According to the present invention, the multiple trenched source-body contacts are formed in unit cell and filled with tungsten plugs for a wide mesa between two adjacent gate trenches in an active area, furthermore, source regions are only formed along channel regions near the gate trenches, not between adjacent trenched source-body contacts for UIS (Unclamped Inductance Switching) current enhancement.

In one aspect, the present invention features a trench MOSFET comprising: a substrate of a first conductivity type; an epitaxial layer of the first conductivity type onto the substrate, wherein the epitaxial layer has a lower doping concentration than the substrate; a plurality of gate trenches starting from a top surface of the epitaxial layer and extending downward into the epitaxial layer; a plurality of body regions of a second conductivity type between two adjacent gate trenches; a plurality of source regions of the first conductivity type in an upper portion of the body regions in an active area; and multiple trenched source-body contacts each filled with a contact metal plug, penetrating through the source regions and extending into the body regions, wherein the source regions are only formed along channel regions near the gate trenches in the active area, not between two adjacent trenched source-body contacts.

In another aspect, the present invention features a trench MOSFET further comprising a plurality of body contact doped regions of the second conductivity type within the body regions and surrounding at least bottoms of the multiple trenched source-body contacts, wherein the body contact doped regions have a higher doping concentration than the body regions.

In another aspect, the present invention features a trench MOSFET wherein the gate trenches can be implemented to have single gate structure comprising a single electrode padded by a gate oxide layer, wherein the gate oxide layer has a thickness along sidewalls equal to or greater than bottom of the single electrode.

In another aspect, the present invention features a trench MOSFET wherein the gate trenches can be implemented to have single gate structure comprising a single electrode padded by a gate oxide layer, wherein the gate insulation layer has a greater thickness along bottom than along sidewalls of the single electrode.

In another aspect, the present invention features a trench MOSFET wherein the gate trenches can be implemented to have terrace gate structure comprising a single electrode padded by a gate oxide layer, wherein the single electrode further extends beyond the top surface of the epitaxial layer, and the gate oxide layer has a greater thickness along bottom than along sidewalls of the single electrode. Alternatively, the gate oxide layer has a thickness along sidewalls equal to or greater than bottom of the single electrode.

In another aspect, the present invention features a trench MOSFET wherein the gate trenches can be implemented to have dual electrodes structure comprising a shielded electrode in a lower portion connected to a source metal, and a gate electrode in an upper portion of the gate trench, wherein the shielded electrode and the gate electrode are insulated from the epitaxial layer and insulated from each other.

Preferred embodiments include one or more of the following features: the contact metal plug is a tungsten metal layer padded by a barrier metal layer of Ti/TiN or Co/TiN or Ta/TiN; the trench MOSFET further comprises multiple trenched body contacts filled with the contact metal plugs and extending into the body regions.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 2 is a cross-sectional view of a preferred embodiment according to the present invention.

DETAILED DESCRIPTION OF THE EMBODIMENTS

Figure 1A:
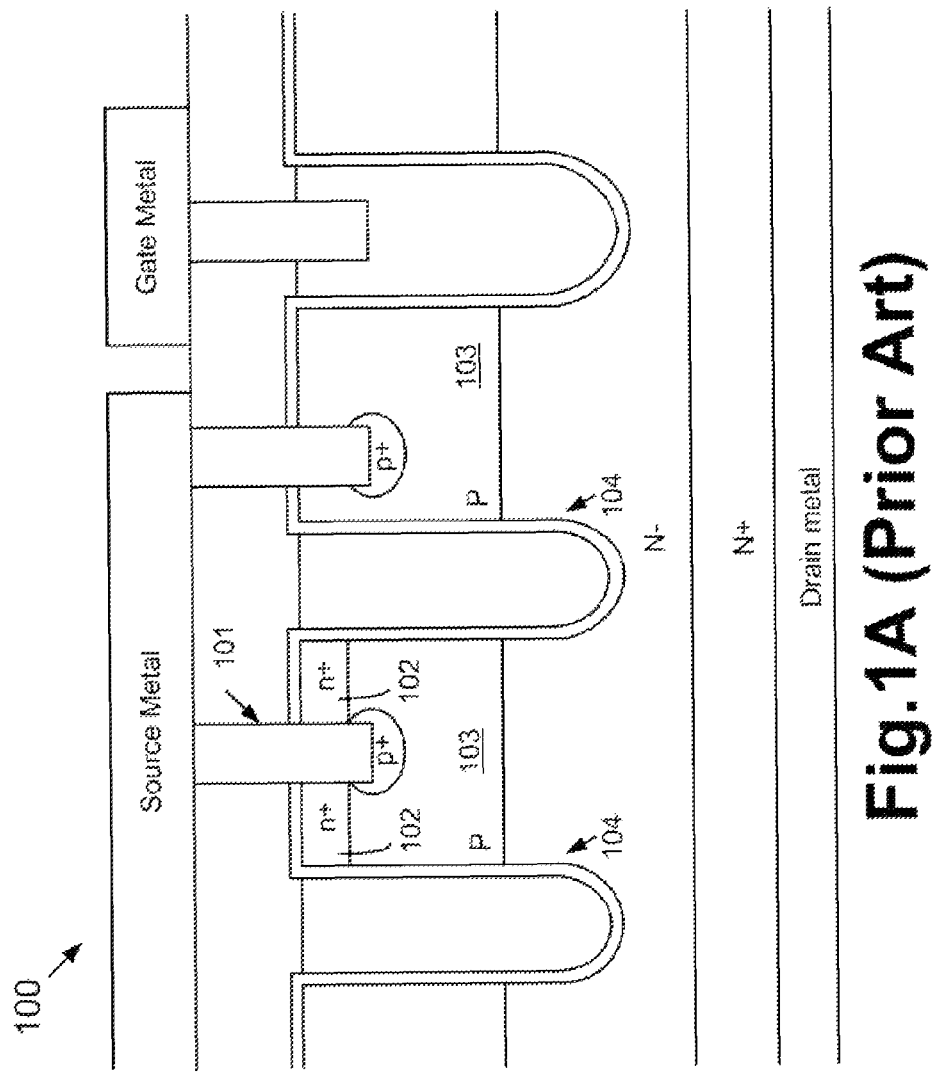
FIG. 1A is a cross-sectional view of a trench MOSFET of a prior art.
Figure 1B:
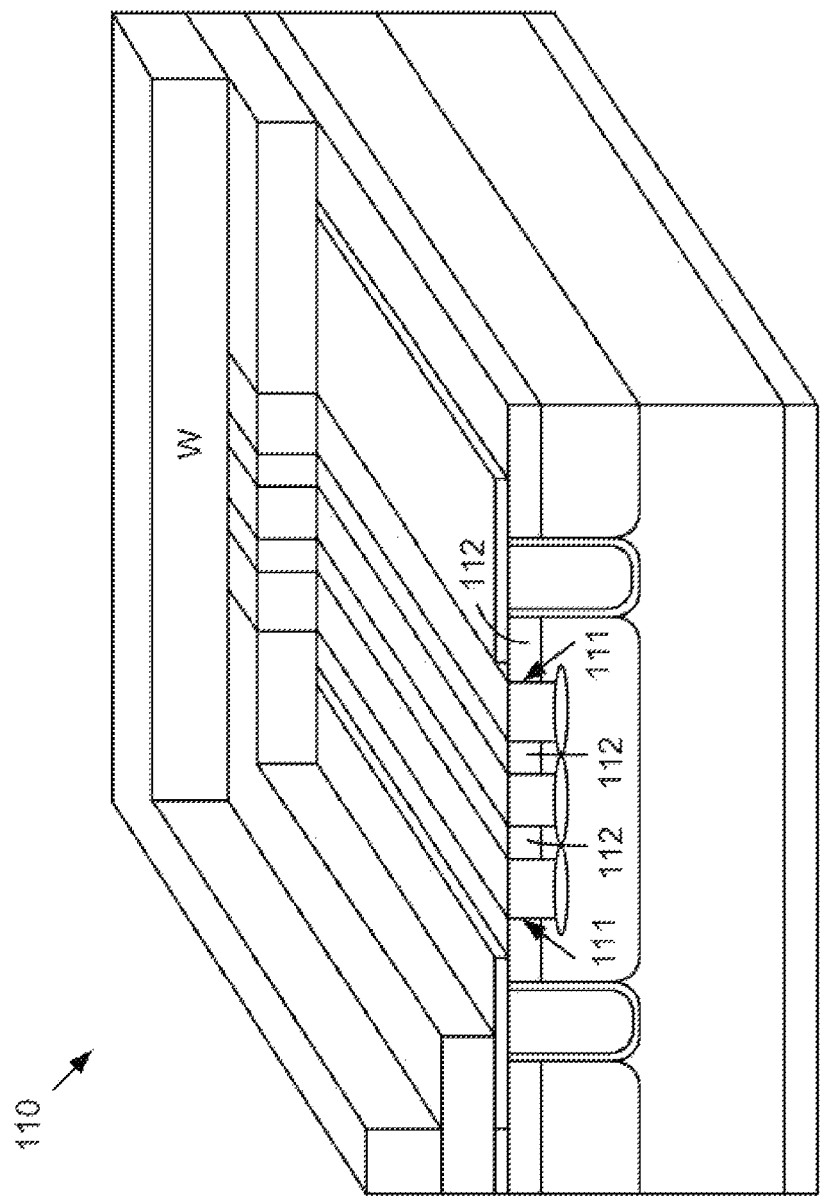
FIG. 1B is a 3D structural diagram showing a trench MOSFET of another prior art.

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Please refer to FIG. 2 for a preferred embodiment of this invention wherein an N-channel trench MOSFET 200 is formed in an N− epitaxial layer 201 onto an N+ substrate 202 coated with a back metal of Ti/Ni/Ag on a rear side as a drain metal 203. A plurality of gate trenches 204 are formed starting from a top surface of the N− epitaxial layer 201 and extending downward into the N− epitaxial layer 201, each of the gate trenches 204 is formed having single gate structure comprising a single electrode 205 padded by a gate oxide layer 206, wherein the gate oxide layer 206 has a thickness along sidewalls equal to along bottom of the single electrode 205. Alternative, the gate oxide layer 206 has a thickness along sidewalls greater than the bottom of the single electrode 205. The single electrode 205 can be implemented by using doped poly-silicon layer. A plurality of P body regions 207 are formed in an upper portion of the N− epitaxial layer 201 between two adjacent gate trenches 204. Two trenched source-body contacts 208-1 and 208-2 filled with contact metal plugs 209-1 and 209-2 are penetrating through a contact interlayer 210 and extending into the P body region 207 in an active area, wherein the contact metal plugs 209-1 and 209-2 are tungsten metal layer padded by a barrier metal layer of Ti/TiN or Co/TiN or Ta/TiN. Specially, n+ source regions 211 are only formed along channel regions near a top surface of the N− epitaxial layer 201 in the active area, not between two adjacent trenched source-body contacts 208-1 and 208-2 for UIS current enhancement. A trenched body contact 214 is filled with the contact metal plug 215 which is as same as the contact metal plugs 209-1 and 209-2 and extending into the P body region 207 adjacent edge of the active area. A plurality of p+ body contact doped regions 212 are formed within the P body regions 207 surrounding at least bottoms of the trenched source-body contacts 208-1 and 208-2 and the trenched body contact 214 to reduce the contact resistance between the P body region 207 and the contact metal plugs 209-1, 209-2 and 215. A trenched gate contact 216 filled with the contact metal plug 218 which is as same as the contact metal plugs 209-1 and 209-2 connects a single electrode 205' in a gate trench 204' in a trenched gate contact area to a gate metal 217 for gate connection, wherein the single electrode 205' has a greater width than the single electrode 205 in the active area.

Figure 3:
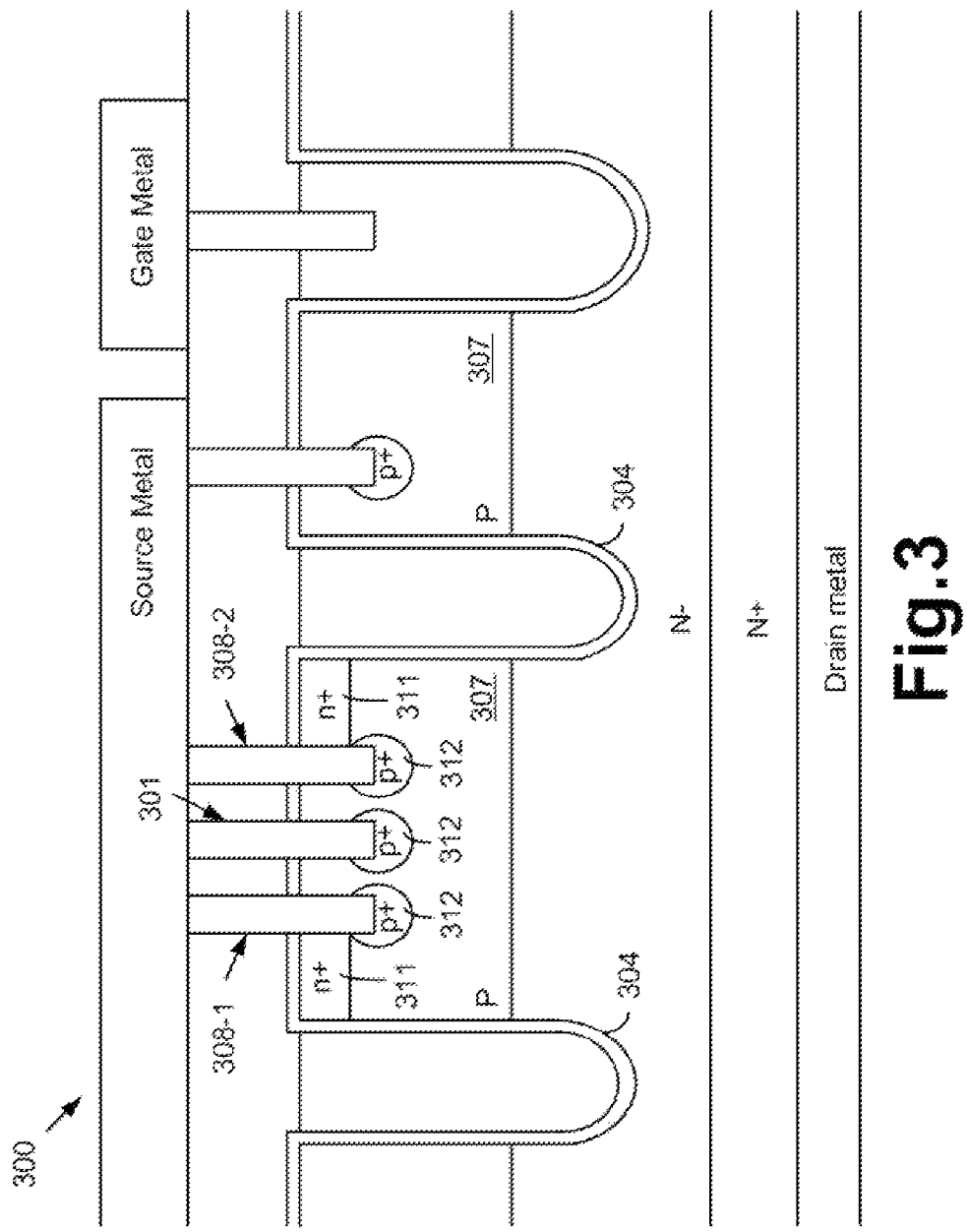
FIG. 3 is a cross-sectional view of another preferred embodiment according to the present invention.

FIG. 3 shows a cross-sectional view of another trench MOSFET 300 according to the present invention. The trench MOSFET 300 has a similar structure to the trench MOSFET 200 in FIG. 2 except that, in FIG. 3, the trench MOSFET 300 further comprises an additional trenched body contact 301 between the trenched source-body contacts 308-1 and 308-2, similarly, n+ source regions 311 only formed along channel regions near the gate trenches 304, not among the trenched source-body contacts 308-1, 308-2 and 301 for UIS current enhancement. Accordingly, the P+ body contact doped regions 312 are formed within the P body regions 307 surrounding at least bottoms of all the trenched contacts to reduce the contact resistance between the P body regions 307 and the contact metal plugs.

Figure 4:
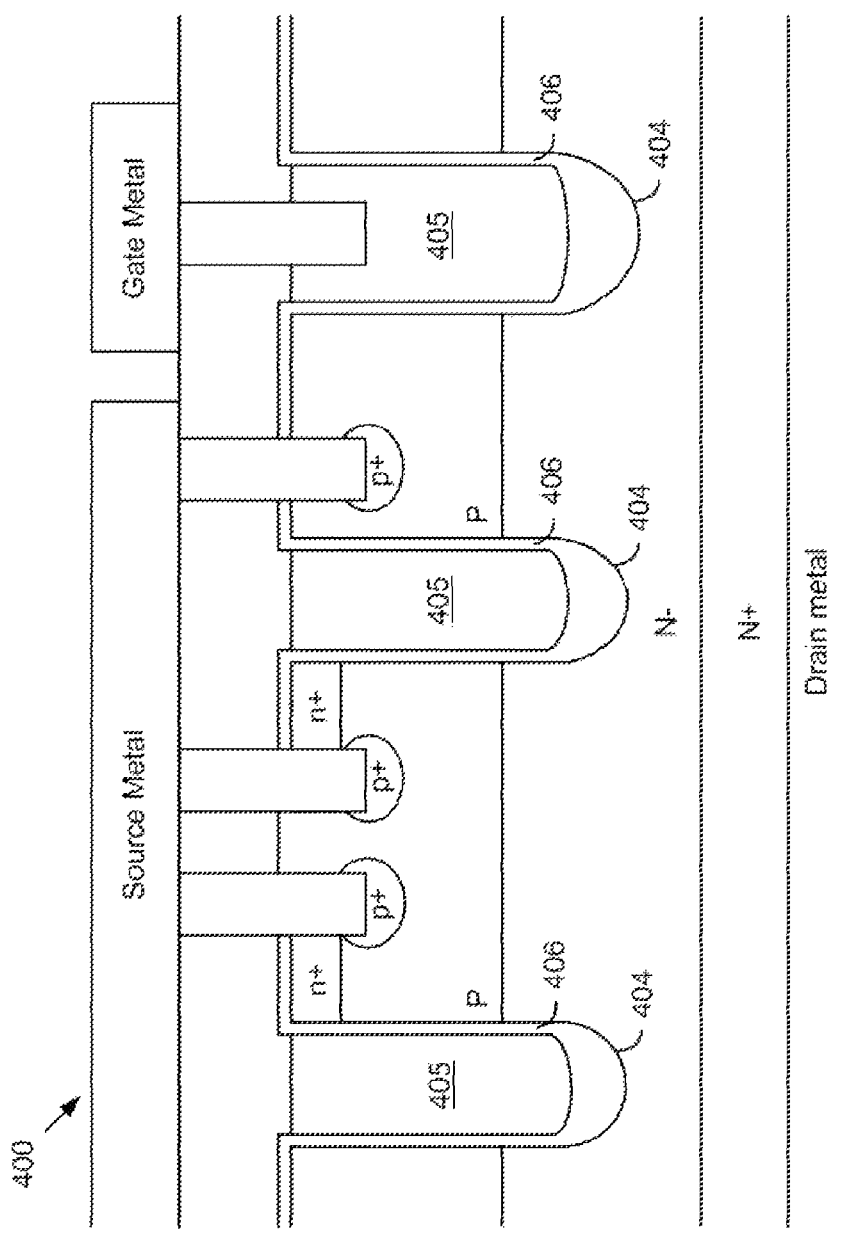
FIG. 4 is a cross-sectional view of another preferred embodiment according to the present invention.

FIG. 4 shows a cross-sectional view of another trench MOSFET 400 according to the present invention. The trench MOSFET 400 has a similar structure to the trench MOSFET 200 in FIG. 2 except that, in FIG. 4, all the gate trenches 404 are formed having single gate structure comprising a single electrode 405 padded by a gate oxide layer 406, wherein the gate oxide layer 406 has a greater thickness along bottom than along sidewalls of the single electrode 405.

Figure 5:
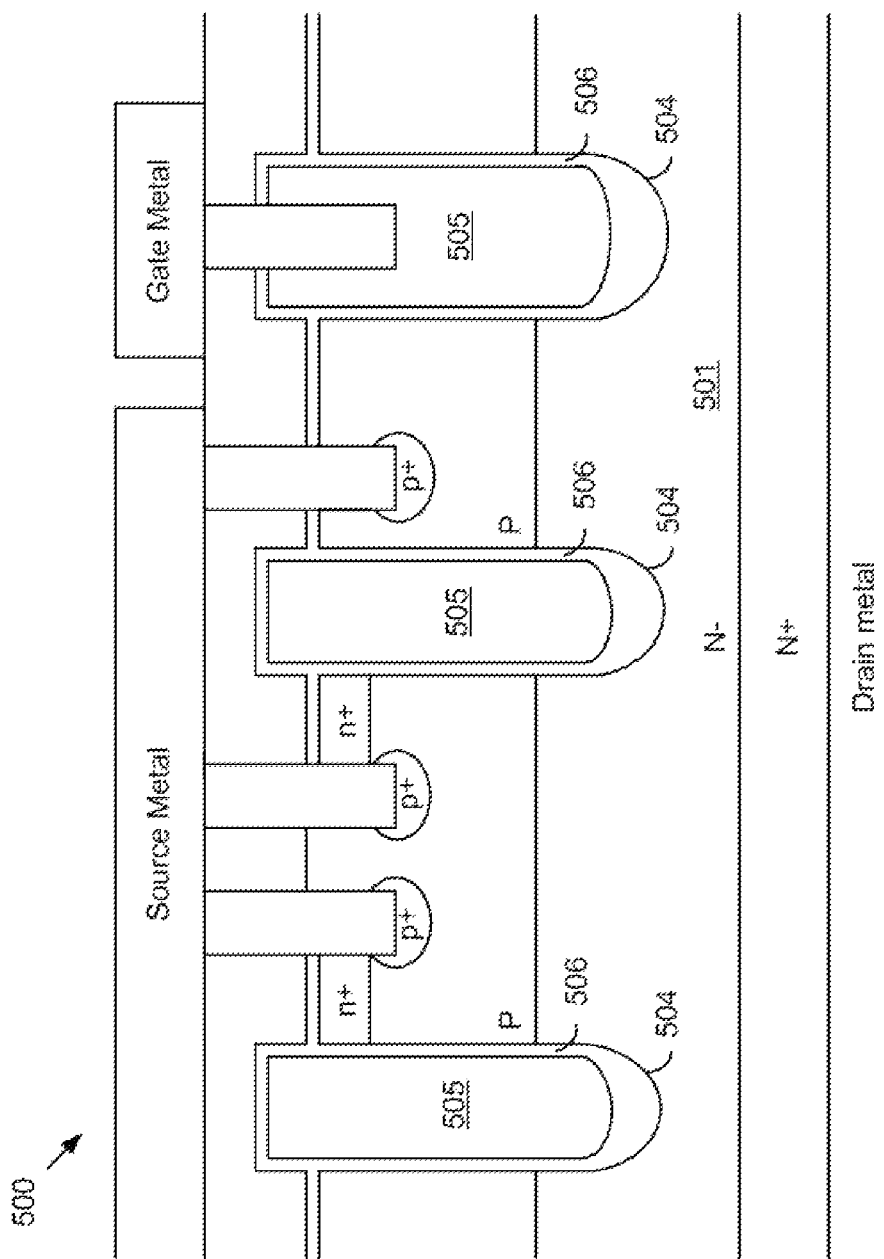
FIG. 5 is a cross-sectional view of another preferred embodiment according to the present invention.

FIG. 5 shows a cross-sectional view of another trench MOSFET 500 according to the present invention. The trench MOSFET 500 has a similar structure to the trench MOSFET 200 in FIG. 2 except that, in FIG. 5, all the gate trenches 504 are formed having terrace gate structure comprising a single electrode 505 padded by a gate oxide layer 506, wherein the single electrode 505 further extends beyond the top surface of the epitaxial layer 501, and the gate oxide layer 506 has a greater thickness along bottom than along sidewalls of the single electrode 505. Alternatively, the gate oxide layer has a thickness along sidewalls equal to or greater than bottom of the single electrode.

Figure 6:
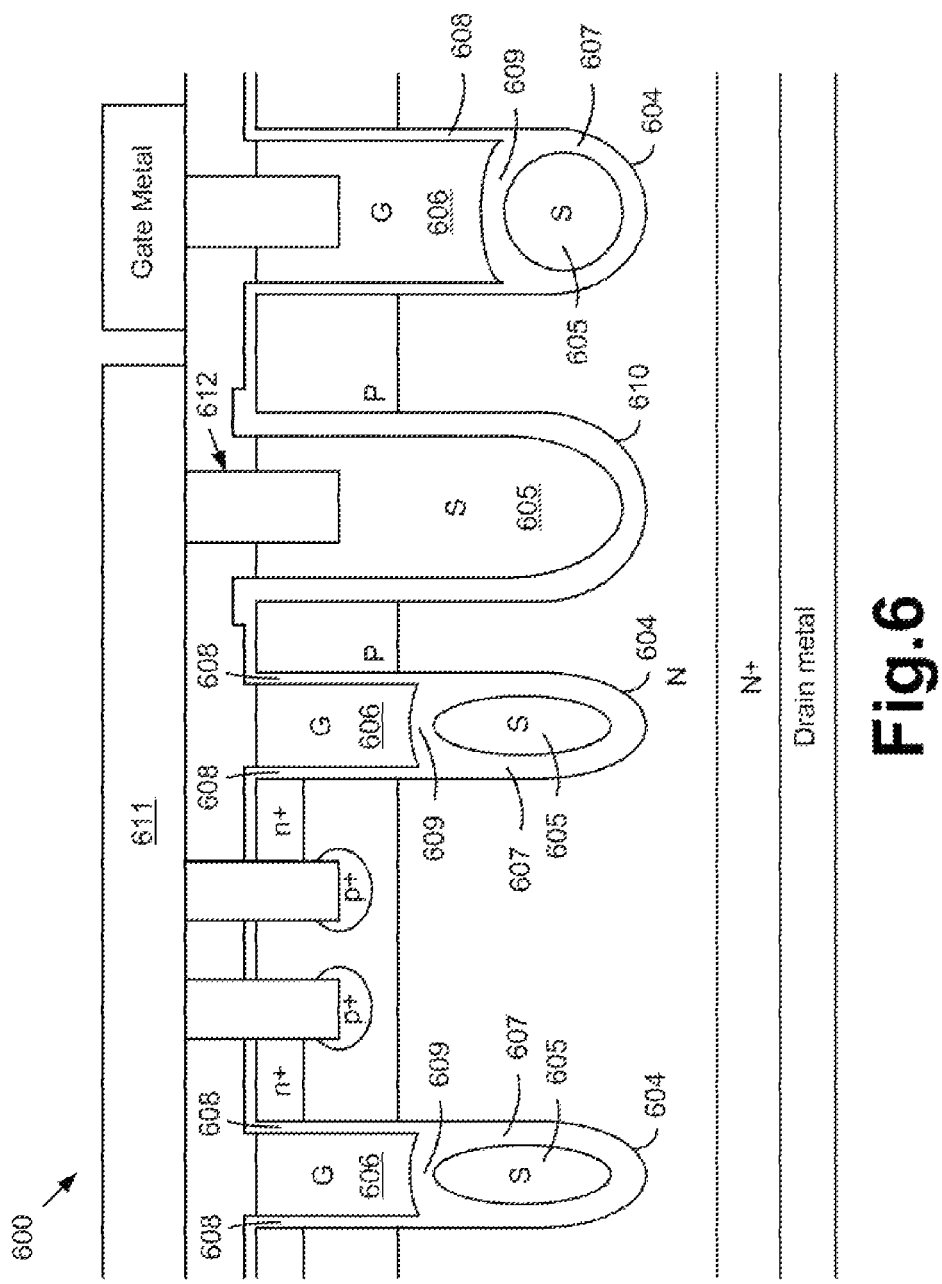
FIG. 6 is a cross-sectional view of another preferred embodiment according to the present invention.

FIG. 6 shows a cross-sectional view of another trench MOSFET 600 according to the present invention. The trench MOSFET 600 has a similar structure to the trench MOSFET 200 in FIG. 2 except that, in FIG. 6, the gate trenches 604 are formed having dual electrodes structure comprising a shielded electrode (S, as illustrated in FIG. 6) 605 in a lower portion and a gate electrode (G, as illustrated in FIG. 6) 606 in an upper portion of the gate trench 604, wherein sidewalls and bottom of the shielded electrode 605 are surrounded by a gate insulation layer 607, sidewalls of the gate electrode 606 are surrounded by a gate oxide layer 608, wherein the shielded electrode 605 and the gate electrode 606 are insulated from each other by an inter-insulation layer 609. The trench MOSFET 600 further comprises a shielded gate trench 610 only filled with the shielded electrode 605 which is connected to a source metal 611 of the trench MOSFET 600 via a trenched shielded electrode contact 612 filled with a contact metal plug.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench MOSFET comprising:

a substrate of a first conductivity type;

an epitaxial layer of said first conductivity type onto said substrate, wherein said epitaxial layer has a lower doping concentration than said substrate;

a plurality of gate trenches starting from a top surface of said epitaxial layer and extending downward into said epitaxial layer;

a plurality of body regions of a second conductivity type between two adjacent gate trenches;

a plurality of source regions of said first conductivity type in an upper portion of said body regions in an active area; and multiple trenched source-body contacts formed between every two adjacent gate trenches in an active area, each filled with a contact metal plug and extending into said body regions, wherein said source regions only formed along channel regions near said gate trenches in said active area, not between adjacent trenched source-body contacts.

2. The trench MOSFET of claim 1 further comprising a plurality of body contact doped regions of said second conductivity type within said body regions and surrounding at least bottoms of said multiple trenched source-body contacts, wherein said body contact doped regions have a higher doping concentration than said body regions.

3. The trench MOSFET of claim 1, wherein said contact metal plug is a tungsten metal layer padded by a barrier metal layer of Ti/TiN or Co/TiN or Ta/TiN.

4. The trench MOSFET of claim 1 further comprising multiple trenched body contacts filled with said contact metal plugs and extending into said body regions near edge of said active area.

5. The trench MOSFET of claim 1, wherein said gate trenches can be implemented to have single gate structure comprising a single electrode padded by a gate oxide layer, wherein said gate oxide layer has a thickness along sidewalls equal to or greater than along bottom of said single electrode.

6. The trench MOSFET of claim 1, wherein said gate trenches can be implemented to have single gate structure comprising a single electrode padded by a gate oxide layer, wherein said gate oxide layer has a greater thickness along bottom than along sidewalls of said single electrode.

7. The trench MOSFET of claim 1, wherein said gate trenches can be implemented to have terrace gate structure comprising a single electrode padded by a gate oxide layer, wherein said single electrode further extends beyond the top surface of said epitaxial layer.

8. The trench MOSFET of claim 1, wherein said gate trenches can be implemented to have shielded gate structure comprising a shielded electrode in a lower portion connected with a source metal, and a gate electrode in an upper portion of said gate trench, wherein sidewalls and bottom of said shielded electrode are surrounded by a gate insulation layer, sidewalls of said gate electrode are surrounded by a gate oxide layer, wherein said shielded electrode and said gate electrode are insulated from each other by an inter-insulation layer.

* * * * *